US012701988B2

(12) United States Patent (10) Patent No.: US 12,701,988 B2
Gao et al. (45) Date of Patent: Aug. 4, 2026

(54) METAL INTERCONNECTION STRUCTURE OF SEMICONDUCTOR DEVICE AND METHOD FOR FORMING THE SAME

(71) Applicant: INSTITUTE OF MICROELECTRONICS, CHINESE ACADEMY OF SCIENCES, Beijing (CN)

(72) Inventors: Jianfeng Gao, Beijing (CN); Weibing Liu, Beijing (CN); Junjie Li, Beijing (CN); Na Zhou, Beijing (CN); Tao Yang, Beijing (CN); Junfeng Li, Beijing (CN); Jun Luo, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 371 days.

(21) Appl. No.: 18/532,246

(22) Filed: Dec. 7, 2023

(65) Prior Publication Data

US 2024/0194598 A1 Jun. 13, 2024

(30) Foreign Application Priority Data

Dec. 8, 2022 (CN) .......................... 202211576205.5

(51) Int. Cl.
*H01L 23/528* (2006.01)
*H01L 21/768* (2006.01)
(Continued)

(52) U.S. Cl.
CPC ....... *H10W 20/435* (2026.01); *H10W 20/033* (2026.01); *H10W 20/056* (2026.01);
(Continued)

(58) Field of Classification Search
CPC . H10W 20/435; H10W 20/41; H10W 20/033; H10W 20/056; H10W 20/00;
(Continued)

(56) References Cited

U.S. PATENT DOCUMENTS 11,011,413 B2 * 5/2021 Wang .................. H10W 20/081
11,342,222 B2 * 5/2022 Hsueh ................. H10W 20/069
(Continued)

FOREIGN PATENT DOCUMENTS

CN 112563244 A 3/2021

OTHER PUBLICATIONS

First Office Action for Chinese Application No. 202211576205.5, dated Jul. 23, 2025, 12 pages including English translation.

*Primary Examiner* — Nikolay K Yushin
(74) *Attorney, Agent, or Firm* — Christopher R. Christenson; Kelly, Holt & Christenson, P.L.L.C.

(57) ABSTRACT

A metal interconnection structure of a semiconductor device and a method for forming the same. The method includes: providing a substrate; forming a first dielectric layer on the substrate; forming a first conductive structure in the first dielectric layer; etching back part of the first conductive structure; forming an etch stop layer on the first conductive structure; forming a second dielectric layer on the etch stop layer and performing chemical mechanical polishing; and forming a second conductive structure in the second dielectric layer, where the second conductive structure is electrically connected to the first conductive structure.

9 Claims, 5 Drawing Sheets

(51) Int. Cl.

| | |
|---|---|
| *H01L 23/522* | (2006.01) |
| *H10W 20/00* | (2026.01) |
| *H10W 20/41* | (2026.01) |
| *H10W 20/42* | (2026.01) |

(52) U.S. Cl.
CPC ....... *H10W 20/077* (2026.01); *H10W 20/081* (2026.01); *H10W 20/42* (2026.01)

(58) Field of Classification Search
CPC . H10W 20/077; H10W 20/081; H10W 20/42; H10W 20/425; H10W 20/47
See application file for complete search history.

(56) References Cited

U.S. PATENT DOCUMENTS

2019/0214296 A1\* 7/2019 Wang ................... H10W 20/081
2021/0098290 A1\* 4/2021 Hsueh ................. H10W 20/069

\* cited by examiner

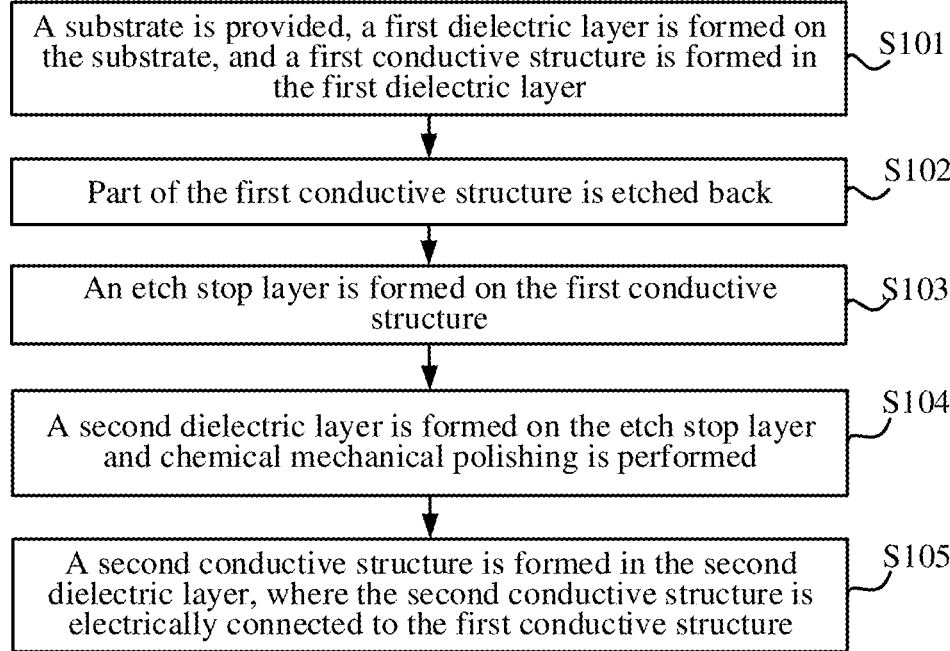

A substrate is provided, a first dielectric layer is formed on the substrate, and a first conductive structure is formed in the first dielectric layer — S101

Part of the first conductive structure is etched back — S102

An etch stop layer is formed on the first conductive structure — S103

A second dielectric layer is formed on the etch stop layer and chemical mechanical polishing is performed — S104

A second conductive structure is formed in the second dielectric layer, where the second conductive structure is electrically connected to the first conductive structure — S105

FIG. 1

METAL INTERCONNECTION STRUCTURE OF SEMICONDUCTOR DEVICE AND METHOD FOR FORMING THE SAME

CROSS REFERENCE TO RELATED APPLICATION(S)

This application claims priority to Chinese Patent Application No. 202211576205.5, filed on Dec. 8, 2022 and entitled "METAL INTERCONNECTION STRUCTURE OF SEMICONDUCTOR DEVICE AND METHOD FOR FORMING THE SAME", the entire content of which is incorporated herein in its entirety by reference.

TECHNICAL FIELD

The present disclosure relates to a field of semiconductor technology, and in particular, to a metal interconnection structure of a semiconductor device and a method for forming the same.

BACKGROUND

In a back-end manufacturing process of semiconductor devices, a process for forming a metal interconnection structure is required. With the continuous reducing of feature sizes of the semiconductor devices, spacing between metal interconnection lines is also getting smaller and smaller, and a demand for alignment accuracy of interconnection structures in different layers is getting higher and higher. However, during a photolithography process, there will definitely be alignment deviations between adjacent interconnection structures. As the spacing of the interconnection lines becomes smaller, the reliability of the interconnection will be reduced, and even the devices will fail.

SUMMARY

The present disclosure provides a metal interconnection structure of a semiconductor device and a method for forming the same.

In an aspect, the present disclosure provides a method for forming a metal interconnection structure of a semiconductor device, including: providing a substrate; forming a first dielectric layer on the substrate; forming a first conductive structure in the first dielectric layer; etching back part of the first conductive structure; forming an etch stop layer on the first conductive structure; forming a second dielectric layer on the etch stop layer and performing chemical mechanical polishing; and forming a second conductive structure in the second dielectric layer, where the second conductive structure is electrically connected to the first conductive structure.

For example, the forming a first conductive structure in the first dielectric layer includes: etching a trench in the first dielectric layer; forming a first diffusion barrier layer in the trench; and filling the trench with a metal.

For example, the forming a second conductive structure in the second dielectric layer includes: forming a through hole in the second dielectric layer by using a single damascene etching process; forming a second diffusion barrier layer on a surface of the through hole; and filling the through hole with a metal material.

For example, the forming a second conductive structure in the second dielectric layer includes: forming a trench and a through hole corresponding to the trench in the second dielectric layer by using a double damascene etching process; forming a second diffusion barrier layer on a surface of the trench and a surface of the through hole; and filling the trench and the through hole with a metal material.

For example, the metal material is any one of W, Co, Cu, Ru, or Al.

For example, the first dielectric layer and the second dielectric layer are made of a low-k material.

For example, a material of the etch stop layer is one of $SiN_x$ or NSiC.

In another aspect, the present disclosure provides a metal interconnection structure of a semiconductor device, including: a substrate; a first dielectric layer on the substrate; a first conductive structure in the first dielectric layer, where a surface of the first conductive structure is lower than a surface of the first dielectric layer; an etch stop layer on the first conductive structure and the first dielectric layer; a second dielectric layer on the etch stop layer; and a second conductive structure in the second dielectric layer, where the second conductive structure is electrically connected to the first conductive structure.

For example, the second conductive structure is a metal through hole, or a combination of a metal through hole and a metal interconnection line.

For example, the first conductive structure includes a metal layer formed in the first dielectric layer and a first diffusion barrier layer between the metal layer and the first dielectric layer.

BRIEF DESCRIPTION OF THE DRAWINGS

FIG. 1 shows a schematic flow chart of a method for forming a metal interconnection structure of a semiconductor device according to an embodiment of the present disclosure;

DETAILED DESCRIPTION OF EMBODIMENTS

Figure 2:
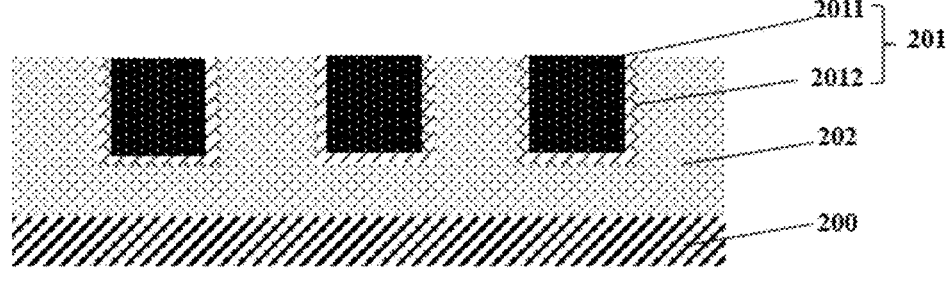
FIG. 2 shows a schematic structural diagram of forming a first conductive structure according to an embodiment of the present disclosure.

In order to make objectives, technical solutions and advantages of the present disclosure clearer, technical solutions of embodiments of the present disclosure will be clearly and completely described below with reference to accompanying drawings. However, it will be understood that these descriptions are merely exemplary rather than limiting the scope of the present disclosure. Based on embodiments of the present disclosure, all other embodiments obtained by those of ordinary skill in the art without carrying out inventive effort fall within the scope of protection of the present disclosure. In addition, in the following, descriptions of well-known structures and techniques are omitted to avoid unnecessary confusion with the concept of the present disclosure.

Various structural schematic diagrams according to embodiments of the present disclosure are shown in the accompanying drawings. These figures are not drawn to scale, and for clarity, some details are enlarged and some others may be omitted. The shapes of the various regions and layers shown in the figures, as well as their relative sizes and positional relationships are only exemplary, and may deviate due to manufacturing tolerances or technical limitations in practice, and those skilled in the art may design regions/layers with different shapes, sizes, and relative positions according to actual needs.

In the context of the present disclosure, when a layer/element is "on" another layer/element, that layer/element may be directly on the another layer/element, or there may be an intermediate layer/element therebetween. In addition, if one layer/element is "on" another layer/element in an orientation, that layer/element may be "under" the another layer/element when the orientation is reversed.

Some embodiments of the present disclosure will be described in detail below in combination with the accompanying drawings. The following embodiments and features in the embodiments may be combined with each other if there is no conflict.

An embodiment of the present disclosure provides a method for forming a metal interconnection structure of a semiconductor device, as shown in FIG. 1, the method includes steps S101 to S105.

In step S101, a substrate is provided, a first dielectric layer is formed on the substrate, and a first conductive structure is formed in the first dielectric layer.

In step S102, part of the first conductive structure is etched back.

In step S103, an etch stop layer is formed on the first conductive structure.

In step S104, a second dielectric layer is formed on the etch stop layer and chemical mechanical polishing is performed;

In step S105, a second conductive structure is formed in the second dielectric layer, where the second conductive structure is electrically connected to the first conductive structure.

According to the method for forming a metal interconnection structure of a semiconductor device provided by embodiments of the present disclosure, the part of the first conductive structure located in a lower layer is etched back, so that an overall height of the first conductive structure is reduced. Then, the second conductive structure is formed on the first conductive structure. Compared with the related art where the second conductive structure is directly formed on the first conductive structure, the method provided by embodiments of the present disclosure may increase a spacing between adjacent metal interconnection structures, thereby increasing a breakdown voltage, which is conducive to eliminating a risk of a short circuit of interlayer interconnection metals or reliability reduction due to an overlay caused by a photolithography process.

In step S101, referring to FIG. 2, a plurality of first conductive structures 201 are formed on the substrate 200, the plurality of first conductive structures 201 correspond to a plurality of semiconductor devices. This step may be implemented by using the following processes, which generally include: forming a first dielectric layer 202 on the substrate 200; etching the first dielectric layer 202 to form a trench; and filling the trench with a metal to form a metal layer 2011. In order to prevent the metal diffusing into the first dielectric layer 202, a first diffusion barrier layer 2012 may be formed before filling the metal in the trench. The metal layer 2011 and the first diffusion barrier layer 2012 together constitute the first conductive structure 201. A material of the first diffusion barrier layer 2012 may be a material with good adhesion such as tantalum (Ta), tantalum nitride (TaN) or Titanium nitride (TiN). The metal filled in the trench may be any one of W, Co, Cu, Ru, or Al.

Figure 3:
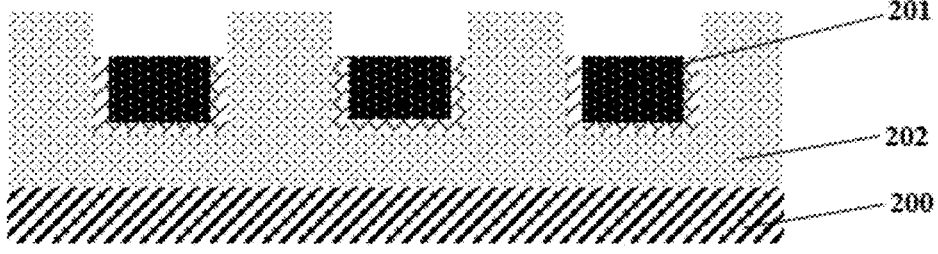
FIG. 3 shows a schematic structural diagram of etching back part of a first conductive structure according to an embodiment of the present disclosure.

In step S102, referring to FIG. 3, part of the first conductive structure 201 is etched back, so that an overall height of the first conductive structure 201 is reduced. In this way, when a conductive structure in an upper layer is formed on the first conductive structure, the spacing between adjacent conductive structures is increased, which is conducive to eliminating a risk of a short circuit of interlayer interconnection metals or reliability reduction due to an overlay caused by a photolithography process, which will be described in detail later.

When the first conductive structure 201 is selectively etched back, both the first diffusion barrier layer 2012 and the filled metal layer 2011 are required to be etched. An appropriate etching process is selected based on different material combinations of the metal layer 2011 and the first diffusion barrier layer 2012. Generally, a two-step etching process is performed, which includes etching away part of the metal layer 2011, and then etching the first diffusion barrier layer 2012.

Figure 4:
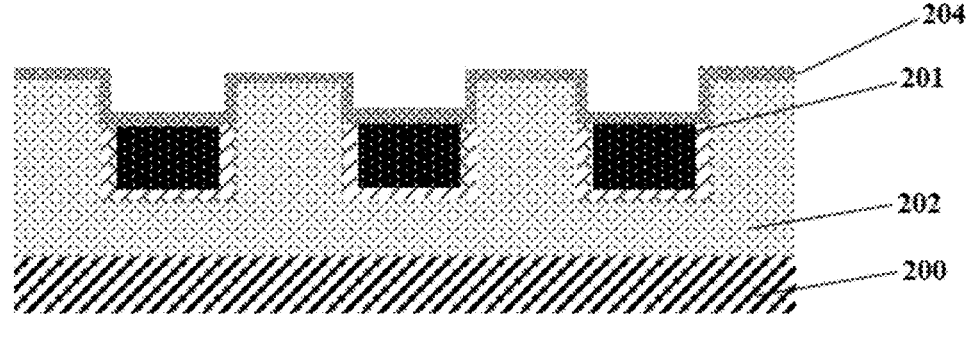
FIG. 4 shows a schematic structural diagram of forming an etch stop layer according to an embodiment of the present disclosure.

In step S103, referring to FIG. 4, an etch stop layer 204 is formed on the first conductive structure 201. The etch stop layer 204 may be one of $SiN_x$ or NSiC.

Figure 5:
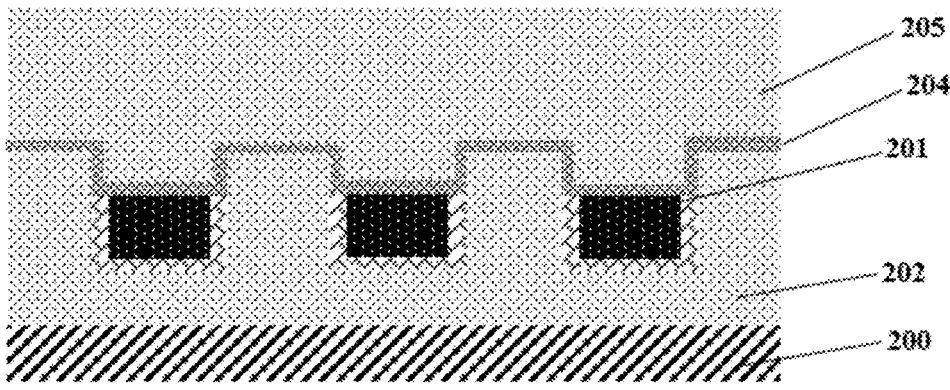
FIG. 5 shows a schematic structural diagram of forming a second dielectric layer according to an embodiment of the present disclosure.

In step S104, referring to FIG. 5, a second dielectric layer 205 is formed on the etch stop layer 204 and a chemical mechanical polishing is performed. The second dielectric layer 205 and the first dielectric layer 202 are made of a low-k material, such as $SiO_2$, doped $SiO_2$, etc.

In step S105, the second conductive structure is formed in the second dielectric layer 205, where the second conductive structure is electrically connected to the first conductive structure. Embodiments of the present disclosure provide two implementations of the second conductive structure.

Figure 6A:
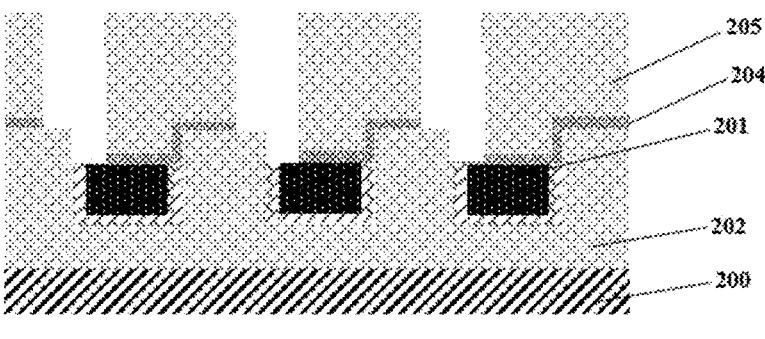
FIG. 6(*a*) to FIG. 6(*c*) show schematic structural diagrams of forming a second conductive structure according to an embodiment of the present disclosure.
Figure 6B:
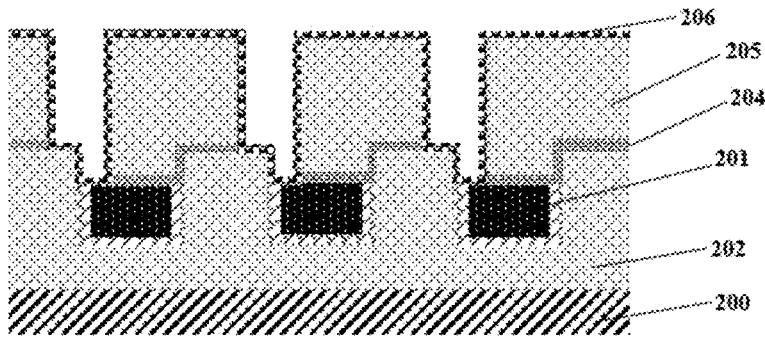
Figure 6C:
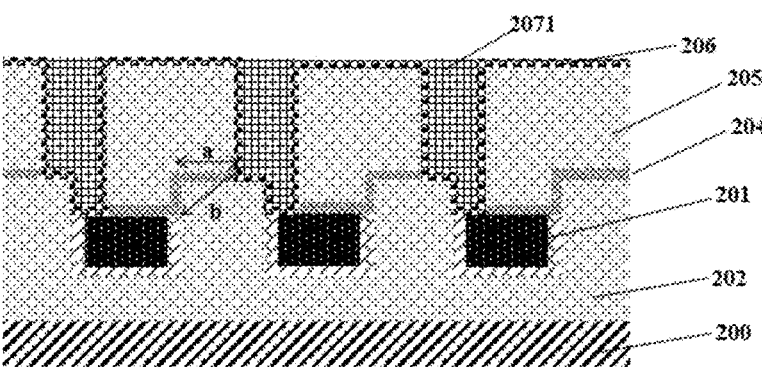

In an implementation, referring to FIG. 6(a) to FIG. 6(c), FIG. 6(a) to FIG. 6(c) show processes of forming the second conductive structure by using a single damascene etching process, where the second conductive structure is a metal through hole. For example, as shown in FIG. 6(a), a through hole is formed in the second dielectric layer 205 by using a single damascene etching process. In order to simulate a possible overlay that may occur in an actual photolithography process, there is a certain offset in the etching pattern. As shown in FIG. 6(b), a second diffusion barrier layer 206 is formed on a surface of the through hole. As shown in FIG. 6(c), the through hole is filled with a metal material, so as to form a second conductive structure 2071. The metal material filled in the through hole may be any one of W, Co, Cu, Ru, or Al.

Figure 7A:
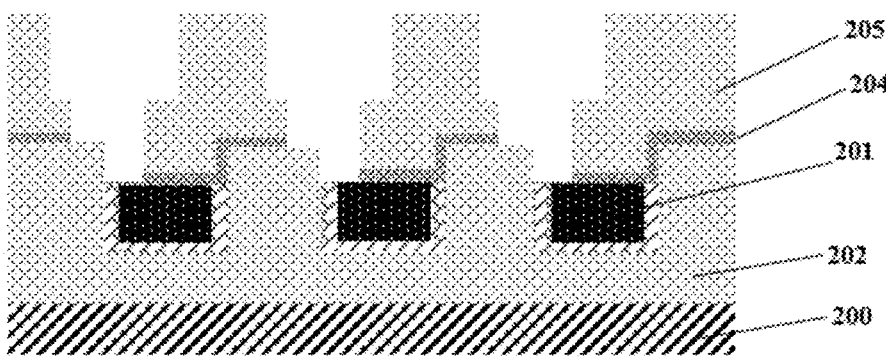
FIG. 7(*a*) to FIG. 7(*c*) show schematic structural diagrams of forming a second conductive structure according to an embodiment of the present disclosure.
Figure 7B:
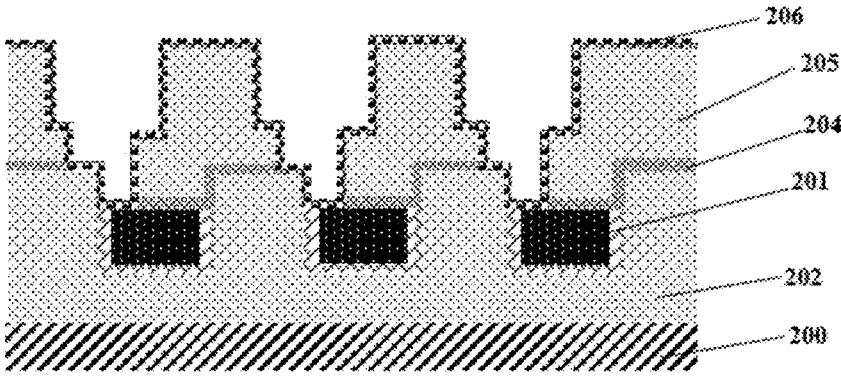
Figure 7C:
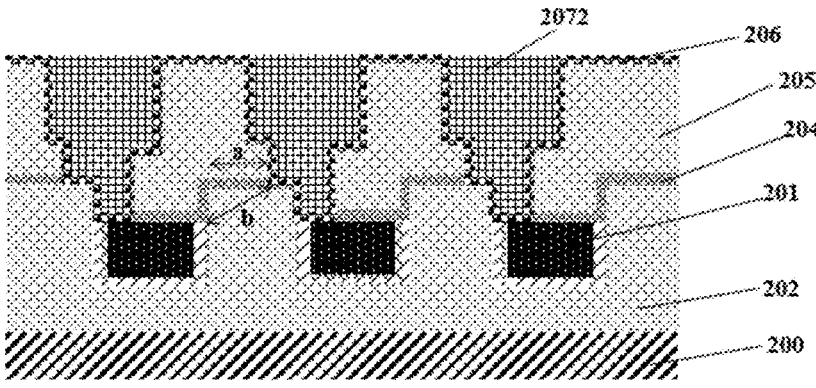

In the other implementation, referring to FIG. 7(a) to FIG. 7(c), FIG. 7(a) to FIG. 7(c) show processes of forming the second conductive structure by using a double damascene etching process, where the second conductive structure is a combination of a metal through hole and a metal interconnection line. For example, as shown in FIG. 7(a), a trench and a through hole corresponding to the trench are formed in the second dielectric layer 205 by using a double damascene etching process. The etching pattern is also offset to simulate an overlay in a photolithography process. As shown in FIG. 7(b), a second diffusion barrier layer 206 is formed on a surface of the trench and a surface of through hole. As shown in FIG. 7(c), the trench and through hole are filled with a metal material, so as to form a second conductive structure 2072. The metal material filled in the trench and through hole is any one of W, Co, Cu, Ru, or Al.

As shown in FIG. 6(c) and FIG. 7(c), if the first conductive structure is not etched back, when there is an alignment deviation in the photolithography process, a distance between adjacent conductive structures is a, whereas if the first conductive structure is etched back, under the same alignment deviation in the photolithography process, a distance between adjacent conductive structures is b. As b is greater than a, it is possible to eliminate the reliability reduction of the adjacent conductive structures caused by the alignment deviation in the photolithography process.

Embodiments of the present disclosure further provide a metal interconnection structure of a semiconductor device, referring to FIG. 6(c) and FIG. 7(c), the metal interconnection structure of the semiconductor device may include: a substrate 200; a first dielectric layer 202 on the substrate; a first conductive structure 201 in the first dielectric layer 202, where a surface of the first conductive structure 201 is lower than a surface of the first dielectric layer 202; an etch stop layer 204 on the first conductive structure 201 and the first dielectric layer 202; a second dielectric layer 205 on the etch stop layer 204; a second conductive structure 2071 or 2072 in the second dielectric layer 205, where the second conductive structure 2071 or 2072 is electrically connected to the first conductive structure 201.

The second conductive structure 2071 is a metal through hole, and the second conductive structure 2072 is a combination of a metal through hole and a metal interconnection line. The first conductive structure 201 includes a metal layer formed in the first dielectric layer and a first diffusion barrier layer between the metal layer and the first dielectric layer.

In the above descriptions, technical details such as patterning and etching of each layer are not explained in detail. However, those skilled in the art should understand that layers and regions with desired shapes may be formed through various technical means. In addition, in order to form the same structure, those skilled in the art may also design methods that are not exactly the same as the methods described above. Although various embodiments have been respectively described above, this does not mean that the measures in various embodiments cannot be advantageously combined.

The above is only specific embodiments of the present disclosure, the scope of protection of the present disclosure is not limited to this. Any changes or replacements that may be clear to those familiar with the art and are within the scope of the techniques disclosed in the present disclosure shall fall within the scope of protection of the present disclosure. Therefore, the protection scope of the present disclosure should be based on the protection scope of the claims.

What is claimed is:

1. A method for forming a metal interconnection structure of a semiconductor device, comprising:
   providing a substrate;
   forming a first dielectric layer on the substrate;
   forming a first conductive structure in the first dielectric layer;
   etching back part of the first conductive structure;
   forming an etch stop layer on the first conductive structure;

forming a second dielectric layer on the etch stop layer and performing chemical mechanical polishing; and
   forming a second conductive structure in the second dielectric layer,
   wherein the second conductive structure is electrically connected to the first conductive structure,
   wherein the forming the first conductive structure in the first dielectric layer comprises: etching the first dielectric layer to form a trench; forming a first diffusion barrier layer in the trench, and then filling with a metal to obtain a metal layer,
   wherein the etching back part of the first conductive structure comprises a two-step etching process, comprising: etching away part of the metal layer; and then etching away an exposed part of a sidewall of the first diffusion barrier layer.

2. The method according to claim 1, wherein the first dielectric layer and the second dielectric layer are made of a low-k material.

3. The method according to claim 1, wherein a material of the etch stop layer is one of $SiN_x$ or NSiC.

4. The method according to claim 1, wherein the forming a second conductive structure in the second dielectric layer comprises:
   forming a through hole in the second dielectric layer by using a single damascene etching process;
   forming a second diffusion barrier layer on a surface of the through hole; and
   filling the through hole with a metal material.

5. The method according to claim 1, the forming a second conductive structure in the second dielectric layer comprises:
   forming a trench and a through hole corresponding to the trench in the second dielectric layer by using a double damascene etching process;
   forming a second diffusion barrier layer on a surface of the trench and a surface of the through hole; and
   filling the trench and the through hole with a metal material.

6. The method according to claim 4, wherein the metal material is any one of W, Co, Cu, Ru, or Al.

7. The method according to claim 5, wherein the metal material is any one of W, Co, Cu, Ru, or Al.

8. A metal interconnection structure of a semiconductor device, comprising:
   a substrate;
   a first dielectric layer on the substrate;
   a first conductive structure in the first dielectric layer, wherein a surface of the first conductive structure is lower than a surface of the first dielectric layer;
   an etch stop layer on the first conductive structure and the first dielectric layer;
   a second dielectric layer on the etch stop layer; and
   a second conductive structure in the second dielectric layer,
   wherein the second conductive structure is electrically connected to the first conductive structure,
   wherein the first conductive structure comprises a metal layer formed in the first dielectric layer and a first diffusion barrier layer between the metal layer and the first dielectric layer, and a surface of the first diffusion barrier layer is flush with a surface of the metal layer.

9. The metal interconnection structure of the semiconductor device according to claim 8, wherein the second conductive structure is a metal through hole or a combination of a metal through hole and a metal interconnection line.

*     *     *     *     *